(12) United States Patent
Haarahiltunen et al.

(10) Patent No.: US 9,306,097 B2
(45) Date of Patent: Apr. 5, 2016

(54) METHOD FOR DECREASING AN EXCESS CARRIER INDUCED DEGRADATION IN A SILICON SUBSTRATE

(71) Applicant: AALTO-KORKEAKOULUSAATIO, Aalto (FI)

(72) Inventors: Antti Haarahiltunen, Perttula (FI); Hele Savin, Espoo (FI); Marko Veli Yli-Koski, Helsinki (FI)

(73) Assignee: AALTO-KORKEAKOULUSAATIO, Aalto (FI)

( * ) Notice: Subject to any disclaimer, the term of this patent is extended or adjusted under 35 U.S.C. 154(b) by 17 days.

(21) Appl. No.: 14/348,673

(22) PCT Filed: Oct. 1, 2012

(86) PCT No.: PCT/FI2012/050937
§ 371 (c)(1),
(2) Date: Mar. 31, 2014

(87) PCT Pub. No.: WO2013/045767
PCT Pub. Date: Apr. 4, 2013

(65) Prior Publication Data
US 2014/0238490 A1    Aug. 28, 2014

(30) Foreign Application Priority Data

Sep. 30, 2011    (FI) .................................... 20115966

(51) Int. Cl.
*H01L 31/18* (2006.01)
*H01L 31/0288* (2006.01)
(Continued)

(52) U.S. Cl.
CPC .......... *H01L 31/0288* (2013.01); *H01L 21/326* (2013.01); *H01L 21/3221* (2013.01);
(Continued)

(58) Field of Classification Search
CPC ... H01L 31/18; H01L 21/3105; H01L 31/028; H01L 31/00; H01L 31/186; G01R 1/04
USPC ............. 438/424, 476; 257/E21.35, E21.275; 324/501, 551, 754.23
See application file for complete search history.

(56) References Cited

U.S. PATENT DOCUMENTS 5,760,594 A    6/1998    Lee
6,249,117 B1 *    6/2001    Koelsch et al. .......... 324/750.02
(Continued)

FOREIGN PATENT DOCUMENTS

JP    2006032859 A    2/2006
JP    2007095774 A    4/2007

OTHER PUBLICATIONS

English machine translation of JP-2007-095774A.*
English machine translation of JP-2007-095774A, published Apr. 12, 2007.*
(Continued)

*Primary Examiner* — Kimberly Rizkallah
*Assistant Examiner* — Brian Turner
(74) *Attorney, Agent, or Firm* — Young & Thompson

(57) ABSTRACT

A method (100) for decreasing an excess carrier induced degradation in a silicon substrate, includes providing (120, 130) a charged insulation layer capable of retaining charge on the silicon substrate for generating a potential difference between the charged insulation layer and the silicon substrate, and heat treating (140) the silicon substrate for enabling an impurity causing the excess carrier induced degradation and being in the silicon substrate to diffuse due to the potential difference into a boundary of the silicon substrate and the insulation layer.

13 Claims, 2 Drawing Sheets

(51) Int. Cl.
    *H01L 31/102*     (2006.01)
    *H01L 21/02*     (2006.01)
    *H01L 23/544*     (2006.01)
    *H01L 31/028*     (2006.01)
    *H01L 21/322*     (2006.01)
    *H01L 21/326*     (2006.01)

(52) U.S. Cl.
    CPC ............ *H01L31/028* (2013.01); *H01L 31/186* (2013.01); *H01L 31/1864* (2013.01); *Y02E 10/547* (2013.01); *Y02P 70/521* (2015.11)

(56) References Cited

U.S. PATENT DOCUMENTS

| | | |
|---|---|---|
| 6,482,269 B1 | 11/2002 | Shive et al. |
| 6,548,382 B1 | 4/2003 | Henley et al. |
| 2003/0207044 A1* | 11/2003 | Sopori .......................... 427/551 |
| 2010/0105190 A1* | 4/2010 | Ferre i Tomas ................ 438/471 |
| 2011/0132444 A1* | 6/2011 | Meier et al. ................... 136/255 |

OTHER PUBLICATIONS

International Search Report dated Jan. 10, 2013, corresponding to PCT/FI2012/050937.

* cited by examiner

METHOD FOR DECREASING AN EXCESS CARRIER INDUCED DEGRADATION IN A SILICON SUBSTRATE

TECHNICAL

The application relates generally to a method for decreasing an excess carrier induced degradation in a silicon substrate.

BACKGROUND

Silicon solar cells with efficiencies higher than 15% are typically made of multicrystalline silicon or single crystalline silicon, which can be either grown by Czochralski or Float-Zone technique. When manufacturing costs of solar cells need to be minimized, it is used the multicrystalline silicon. Solar cells made from Czochralski and float-zone silicon are comparable in cost, but Float-Zone silicon is used for high-efficiency applications.

It has been studied that both Czochralski and Float-Zone solar cells suffer from an unstable efficiency, which tends to degrade under sunlight when a minority-carrier lifetime in the solar cells reduces. This phenomenon is known as a light induced minority-carrier lifetime degradation and it is currently a serious problem limiting a solar cell efficiency.

It is known that the light induced minority-carrier lifetime degradation has a clear dependency on a copper concentration regardless of the silicon material. The lifetime degradation due to copper can be explained by the fact that the copper has a high diffusivity in silicon also at room temperature. Light activation of the interstitial copper reduces an electrostatic repulsion between positively charged interstitial copper ions and copper precipitates, which enables copper to precipitate in the wafer bulk even at a low concentration level. Such formation of the copper precipitates increases the recombination activity, which naturally has a strong negative effect on the solar cell efficiency.

SUMMARY

Therefore, one object of the invention is to withdraw the above-mentioned drawback and provide a method for improving a performance of solar cells that can be carried out to even a raw material of solar cells.

The object of the invention is fulfilled by providing a method of claim 1, a silicon substrate structure of claim 8, and an apparatus of claim 9.

According to an embodiment of the invention a method for decreasing an excess carrier induced degradation in a silicon substrate comprises providing a charged insulation layer capable of retaining charge on the silicon substrate for generating a potential difference between the charged insulation layer and the silicon substrate. The method further comprises heat treating the silicon substrate for enabling at least one impurity causing the excess carrier induced degradation and being in the silicon substrate to diffuse due to the potential difference into a boundary of the silicon substrate and the insulation layer.

The term "silicon substrate" refers to any kind of silicon substrate. The silicon substrate can comprise e.g. p-type and/or n-type silicon depending on used dopants. The p-type silicon comprises e.g. boron, aluminium, gallium, and/or indium, and the n-type silicon e.g. phosphorous and/or arsenic. When the silicon substrate comprises both p-type and n-type silicon, it naturally has a p-n junction at a boundary between the different silicon types. The silicon substrate can also comprise compensated silicon, in which the p-type silicon also comprises e.g. phosphorous and/or arsenic or in which the n-type silicon also comprises at least one p-type dopants.

The term "excess carrier induced degradation" refers to e.g. a light induced degradation or a minority-carrier injection based degradation.

The term "impurity" refers at least one impurity, e.g. one or more impurity atoms.

According to an embodiment of the invention a silicon substrate structure having a decreased excess carrier induced degradation comprises a charged insulation layer for generating a potential difference between the charged insulation layer and a silicon substrate. The charged insulation layer being capable of retaining charge and being provided on the silicon substrate. The silicon substrate structure further comprises the silicon substrate being heat treated for enabling at least one impurity causing the excess carrier induced degradation and being in the silicon substrate to diffuse due the potential difference into a boundary of the silicon substrate and the charged insulation layer.

According to an embodiment of the invention an apparatus having a decreased excess carrier induced degradation comprises a silicon substrate that has been influenced by a charged insulation layer generating a potential difference between the charged insulation layer and a silicon substrate. The charged insulation layer being capable of retaining charge and being provided on the silicon substrate. The apparatus further comprises the silicon substrate being heat treated for enabling at least one impurity causing the excess carrier induced degradation and being in the silicon substrate to diffuse due the potential difference into a boundary of the silicon substrate and the charged insulation layer.

Further embodiments of the invention are defined in dependent claims.

A method according to embodiments of the invention eases a silicon substrate treatment since it does not require a completed solar cell structure with a p-n-junction. The treatment for decreasing the lifetime degradation is possible to carry out with a simple p-type or n-type silicon substrate.

In addition, a method according to embodiments of the invention simplifies and eases the silicon substrate treatment since it is possible to carry out in a room temperature without any extra heating process in temperatures higher than the room temperature.

In addition, a method according to embodiments of the invention efficiently improves a performance of the silicon substrate material as well as a performance, e.g. efficiency, of solar cells produced by such silicon substrate material.

The verb "to comprise" is used in this document as an open limitation that neither excludes nor requires the existence of also unrecited features. The verbs "to include" and "to have/has" are defined as to comprise.

The terms "a", "an" and "at least one", as used herein, are defined as one or more than one and the term "plurality" is defined as two or more than two.

The term "another", as used herein, is defined as at least a second or more.

The term "or" is generally employed in its sense comprising "and/or" unless the content clearly dictates otherwise.

For the above-mentioned defined verbs and terms, these definitions shall be applied, unless a different definition is given in the claims or elsewhere in this description/specification.

Finally, the features recited in depending claims are mutually freely combinable unless otherwise explicitly stated.

BRIEF DESCRIPTION OF THE FIGURES

The exemplary embodiments of the invention will be described with reference to the accompanying figures in which.

DETAILED DESCRIPTION OF THE FIGURES

Figure 1:
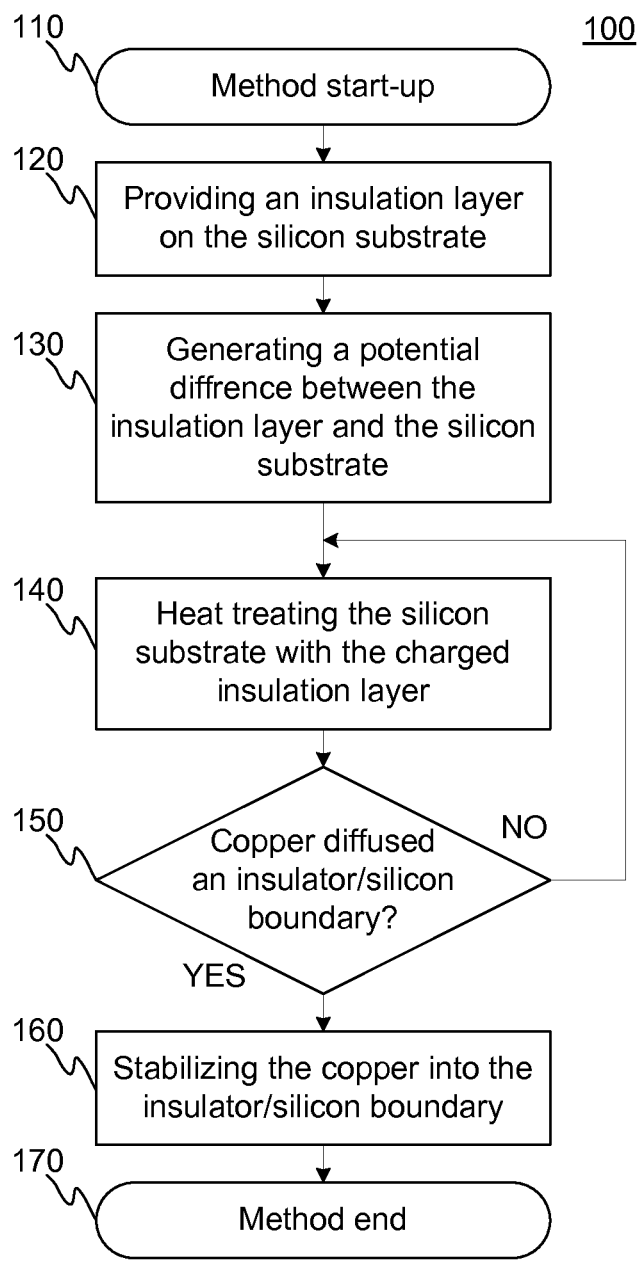
FIG. 1 illustrates a flowchart of a method for decreasing an excess carrier induced degradation in a silicon substrate.

FIG. 1 illustrates a flowchart describing a method 100 for deactivating an impurity causing the excess carrier induced degradation, e.g. copper, in a silicon substrate and, thus, decreasing an excess carrier induced minority-carrier lifetime degradation in the silicon substrate to be used e.g. in a solar cell fabrication. The impurity that causes the detrimental excess carrier induced degradation, i.e. in this case a light induced degradation, can also be e.g. iron.

During a method start-up in step 110, a blank monocrystalline or multicrystalline silicon substrate is manufactured by means of e.g. a Czochralski process or a block casting process. The silicon substrate can comprise p-type and/or n-type silicon depending on used dopants. The p-type silicon comprises e.g. boron, aluminium, gallium, and/or indium, and the n-type silicon e.g. phosphorous and/or arsenic. When the silicon substrate comprises both p-type and n-type silicon, it naturally has a p-n junction at a boundary between the different silicon types.

In step 120 an insulation layer that is capable of retaining charge is provided directly on an outer surface of the silicon substrate. Such insulation layer can comprise at least one of e.g. followings: native oxide, thermal oxide, and an aluminium oxide layer.

The insulation layer can be produced e.g. by enabling the silicon substrate to react with ambient air and air pressure, whereupon the native oxide (silicon dioxide) layer is generated on the silicon substrate, or by depositing in a process chamber the thermal oxide (silicon dioxide) and/or aluminium oxide layer.

In step 130 the insulation layer is charged for generating a potential difference between the charged insulation layer and the silicon substrate in order to manipulate a copper distribution, in the silicon substrate. The charging process can be provided by applying a corona charge, e.g. a negative corona charge, into the insulation layer.

Alternatively, the provided insulation layer can be a naturally charged insulation layer, e.g. the aluminium oxide layer, whereupon there is no need to the distinct charging process.

It is also possible to develop e.g. a silicon nitride layer on the provided silicon dioxide layer in step 120 and the charging process step 130 is carried out by means of a positive corona charge.

In step 140 the silicon substrate together with the charged insulation layer are heat treated in e.g. a room temperature, i.e. in temperature of 20-25° C., for enabling copper in the silicon substrate to diffuse due to the potential difference into a boundary of the silicon substrate and the insulation layer such that the copper is collected into the boundary and its influence to the lifetime degradation in the silicon substrate is deactivated. Alternative temperature can be used in step 140 and only limit for the temperature is maximum temperature that is about 300-400° C.

The heat treatment of step 140 is continued in step 150 until the copper has diffused. Duration of the heat treatment depends on a used temperature, charge, and/or silicon substrate.

Then, in step 160 it is possible to ensure a result of the manipulation of the copper distribution by stabilizing the controlled copper into the boundary by another heat treatment and/or by illuminating the silicon substrate and the charged insulation layer, whereupon the deactivation has been completed. Again, duration of another heat treatment depends on a used temperature, charge, and/or silicon substrate. Duration of the illuminating process depends on a used temperature, charge, silicon substrate, and illumination means.

The processed silicon substrate, where copper atoms have been attached and controlled on a vicinity of the outer surface of the silicon substrate, can be used as a raw material for a solar cell.

Then, the method 100 is ended in step 170.

Figure 2:
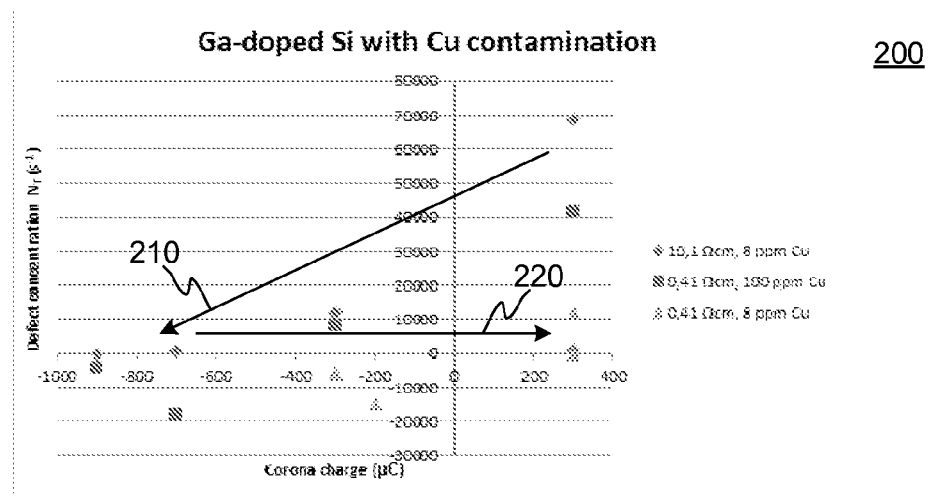
FIG. 2 illustrates how corona charging influences to a silicon substrate.

In FIG. 2 a table 200 shows how corona charging deactivates copper in a gallium doped silicon. A horizontal axis representing a corona charge and a vertical axis a defect concentration $N_t$ in the doped silicon that is determined as follows:

$$N_t = \frac{1}{t_2} - \frac{1}{t_1}$$

wherein $t_2$ represents a minority-carrier lifetime after an illumination and $t_1$ represents the minority-carrier lifetime before the illumination.

As one can see from the table 200, a negative corona charge influences to the doped silicon having a copper contamination so that the defect concentration decreases drastically as an arrow 210 shows. Even if the doped silicon is exposed to a positive corona charge after deactivation, the defect concentration still remains essentially same as an arrow 220 shows.

Figure 3:
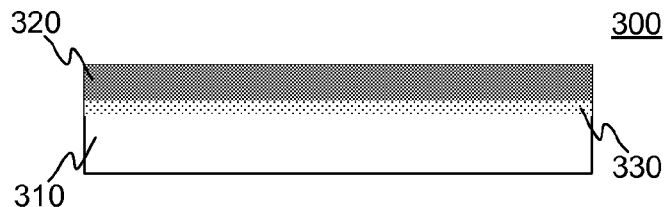
FIG. 3 illustrates a cross-section of a deactivated silicon substrate.

FIG. 3 illustrates a cross-section of a silicon substrate structure 300, e.g. a multicrystalline silicon substrate structure, which has been processed by the copper deactivation method 100 for decreasing an excess carrier induced degradation.

The structure 300 comprises a copper contaminated and gallium doped silicon substrate 310 that is manufactured e.g. by the Czochralski process. Directly on an outer surface of the silicon substrate 310 has been provided a charged insulation layer 320 that is capable of retaining charge.

The insulation layer 320 to be charged is provided by enabling the silicon substrate 310 to react with ambient air and air pressure in order to produce a native oxide layer, and/or by depositing a thermal oxide and/or aluminium oxide layer on the silicon substrate 310 in a process chamber.

The provided insulation layer 320 is charged by applying a negative corona charge into the insulation layer 320, whereupon a generated potential difference between the copper contaminated silicon substrate 310 and the insulation layer 320 enforces copper atoms to diffuse towards a surface area 330 that locates on a boundary of the silicon substrate 310 and the insulation layer 320.

Then, the silicon substrate 310 has been exposed to a heat treatment, e.g. in a room temperature, for collecting the copper atoms into the boundary 330 and, thus, for finishing the copper diffusion.

The silicon substrate 310 having a controlled copper distribution can be further heat treated and/or illuminated after the copper diffusion has been completed for stabilizing the copper into the boundary 330. The stabilized silicon substrate 300 can be used as such or after a further processing as a solar cell material.

Figure 4:
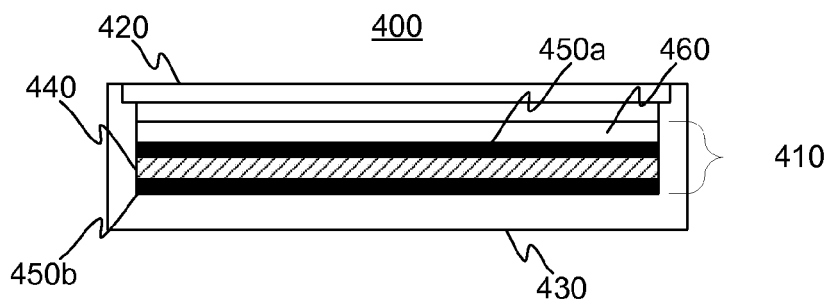
FIG. 4 illustrates a cross-section of a solar cell having a deactivated silicon substrate.

FIG. 4 illustrates a cross-section of a solar cell panel 400 capable of absorbing solar radiation.

The solar cell panel 400 comprises a solar cell 410 and a transparent cover 420, e.g. a glass or polycarbonate cover, which allows the solar radiation to pass to the solar cell 410 and reduces heat loss from the solar cell 410. In addition, the solar cell panel 400 comprises required connections between the solar cell 410 and a battery to be charged, and a panel frame 430 that together with the cover 420 shelters the solar cell 410 and the connections. Naturally, the solar cell panel 400 can comprise more than one solar cell 410 and required interconnections between solar cells 410.

The solar cell 410 comprises a copper contaminated silicon substrate 440 where copper has been deactivated by means of an insulation layer, a charging process, and a heat treatment for decreasing an excess carrier induced degradation. In addition, the solar cell 410 comprises contacts 450a, 450b and an antireflective layer 460.

The silicon substrate 440 comprises at least a p-type silicon layer and a n-type silicon layer, and a p-n junction between the silicon layers. At least one of the p-type and n-type silicon layers is treated such that copper atoms in a silicon layer 440 are deactivated. The silicon substrate 440 may comprise an insulation layer that has been used in the copper deactivation on one side of it, but it is also possible that the insulation layer or part of it has been removed when the contacts 450a, 450b and the antireflective layer 460 have been produced.

Copper atoms in the silicon substrate 440 have been deactivated by providing directly on an outer surface of the silicon substrate 440 the charged insulation layer, e.g. a silicon dioxide layer, which is capable of retaining charge.

The insulation layer to be charged is provided by enabling the silicon substrate 440 to react with ambient air and air pressure in order to produce a native oxide layer and/or by depositing a thermal oxide layer on the silicon substrate 440 in a process chamber.

The insulation layer has been charged by applying e.g. a negative corona charge into the insulation layer in order to generate a potential difference between the copper contaminated silicon substrate 440 and the insulation layer, whereupon the potential difference enforces the copper atoms to diffuse towards a boundary of the silicon substrate 440 and the insulation layer.

Then, the silicon substrate 440 has been exposed to a heat treatment, e.g. in a room temperature, for finishing a collection of the copper atoms into the boundary and achieving the copper deactivated silicon substrate 440.

It is possible to improve a result of the copper deactivation, by heat treating and/or illuminating the silicon substrate 440 having a manipulated copper distribution after the copper diffusion has been finished for stabilizing the copper into the boundary.

The invention has been now explained above with reference to the aforesaid embodiments and the several advantages of the invention have been demonstrated. It is clear that the invention is not only restricted to these embodiments, but comprises all possible embodiments within the spirit and scope of the invention thought and the following patent claims.

The invention claimed is:

1. A method for decreasing a light induced degradation caused by an impurity in a silicon substrate which is doped by at least one p-type dopant, the method comprising:
   providing a charged insulation layer capable of retaining charge on the silicon substrate for generating a potential difference between the charged insulation layer and the silicon substrate,
   heat treating the silicon substrate for enabling the impurity causing the light induced degradation and being in the silicon substrate to diffuse due to the potential difference into a boundary of the silicon substrate and the insulation layer,
   stabilizing the impurity into the boundary by heat treating the silicon substrate after the diffusion of the impurity has completed to provide a processed silicon substrate, and
   using the processed silicon substrate to form a solar cell.

2. The method of claim 1, wherein an insulation layer to be charged is provided by enabling the silicon substrate to react with air and/or by depositing in a process chamber.

3. The method of claim 1, wherein the charged insulation layer comprises at least one of followings: native oxide, thermal oxide, and aluminium oxide.

4. The method of claim 1, wherein the insulation layer is charged by applying a corona charge into the insulation layer.

5. The method of claim 1, wherein the heat treating step is provided in a room temperature.

6. The method of claim 1, wherein the method further comprises stabilizing the impurity into the boundary by heat treating and/or illuminating the silicon substrate after the diffusion of the impurity has completed.

7. The method of claim 1, wherein the processed silicon substrate is used in a solar cell.

8. A silicon substrate structure comprising a silicon substrate processed by the method of claim 1.

9. An apparatus comprising a silicon substrate processed by the method of claim 1.

10. A method for decreasing a light induced degradation, the method comprising:
    providing an oxide insulation layer that retains charge on a silicon substrate, the silicon substrate being doped with a p-type dopant and containing an impurity that causes light induced degradation;
    generating a potential difference between the oxide insulation layer and the silicon substrate to charge the oxide insulation layer, and
    heat treating the silicon substrate to diffuse the impurity that causes the light induced degradation due to the potential difference into a boundary of the silicon substrate and the oxide insulation layer and collect the impurity that causes the light induced degradation into the boundary, thereby reducing lifetime light induced degradation in the silicon substrate,
    stabilizing the impurity into the boundary by heat treating the silicon substrate after the diffusion of the impurity has completed to provide a processed silicon substrate, and
    using the processed silicon substrate to form a solar cell.

11. The method of claim 10, wherein the oxide insulation layer is comprises at least one of native oxide, thermal oxide, and aluminium oxide.

12. The method of claim 10, wherein the oxide insulation layer is charged by applying a corona charge into the oxide insulation layer.

13. The method of claim 10, wherein the heat treating step is performed at room temperature.

* * * * *